(12) United States Patent
Grzesik

(10) Patent No.: US 10,177,181 B2
(45) Date of Patent: Jan. 8, 2019

(54) FUSE-PROTECTED ELECTRONIC PHOTODIODE ARRAY

(71) Applicant: Massachusetts Institute of Technology, Cambridge, MA (US)

(72) Inventor: Michael J. Grzesik, Lompoc, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 127 days.

(21) Appl. No.: 14/722,702

(22) Filed: May 27, 2015

(65) Prior Publication Data

US 2017/0084645 A1  Mar. 23, 2017

Related U.S. Application Data

(60) Provisional application No. 62/003,661, filed on May 28, 2014.

(51) Int. Cl.
| | |
|---|---|
| *H01L 27/144* | (2006.01) |
| *H01H 85/25* | (2006.01) |
| *H01H 85/046* | (2006.01) |
| *H01L 31/02* | (2006.01) |
| *H01L 31/102* | (2006.01) |
| *H01H 85/02* | (2006.01) |

(52) U.S. Cl.
CPC ....... *H01L 27/1446* (2013.01); *H01H 85/046* (2013.01); *H01H 85/25* (2013.01); *H01L 27/1443* (2013.01); *H01L 31/02005* (2013.01); *H01L 31/02027* (2013.01); *H01L 31/102* (2013.01); *H01H 2085/0275* (2013.01); *H01L 2924/00* (2013.01)

(58) Field of Classification Search
CPC ............... H01L 27/1446; H01L 31/102; H01L 31/02005; H01L 27/1443
USPC ....................................................... 257/443
See application file for complete search history.

(56) References Cited

U.S. PATENT DOCUMENTS

| | | | |
|---|---|---|---|
| 3,699,403 A * | 10/1972 | Boleky, III | G11C 17/16 257/507 |
| 4,908,692 A | 3/1990 | Kikuchi et al. | |
| 6,552,514 B2 | 2/2003 | Torazawa | |

(Continued)

OTHER PUBLICATIONS

"Adhesive Wafer Bonding for Microelectronic and Microelectromechanical Systems" Frank Niklaus, Microsystem Technology Department of Signals, Sensors and Systems Royal Institute of Technology, Stockholm 2002.*

(Continued)

*Primary Examiner* — Marc Armand
*Assistant Examiner* — Sue Tang
(74) *Attorney, Agent, or Firm* — Theresa A. Lober

(57) ABSTRACT

There is provided a photodiode array including a semiconducting substrate and a plurality of photodiodes that are disposed at a surface of the substrate. Each photodiode is laterally spaced apart from neighboring photodiodes by a lateral substrate surface region. An optical interface surface of the substrate is arranged for accepting external input radiation. A plurality of electrically conducting fuses are disposed on the substrate surface. Each fuse is connected to a photodiode in the plurality of photodiodes. Each fuse is disposed at a lateral substrate surface region that is spaced apart from neighboring photodiodes in the plurality of photodiodes.

15 Claims, 14 Drawing Sheets

(56) References Cited

U.S. PATENT DOCUMENTS

| | | |
|---|---|---|
| 7,419,856 B2 | 9/2008 | Kim |
| 7,713,792 B2 | 5/2010 | Chinthakindi et al. |
| 8,586,466 B2 | 11/2013 | Lee et al. |
| 2002/0109147 A1* | 8/2002 | Shirai .................. G02B 6/4249 257/93 |
| 2003/0071323 A1 | 4/2003 | Chou et al. |
| 2004/0173863 A1* | 9/2004 | Gidon ............... H01L 31/02002 257/434 |
| 2005/0133800 A1* | 6/2005 | Park .................... H01L 25/0756 257/80 |
| 2009/0109582 A1* | 4/2009 | Jack ..................... H01H 85/046 361/56 |
| 2010/0117190 A1 | 5/2010 | Chuang et al. |
| 2011/0169117 A1 | 7/2011 | McIntosh et al. |
| 2011/0241117 A1* | 10/2011 | Wei .................... H01L 23/5256 257/355 |

OTHER PUBLICATIONS

PCT/US15/32606, International Search Report, First Sheet, Second Sheet, dated Aug. 2015.
PCT/US15/32606, Written Opinion of the International Searching Authority, Cover Sheet, Box No. 1 Sheet, Box No. V sheet, Box No. VII sheet, Supplemental Box sheet, dated Aug. 2015.

* cited by examiner

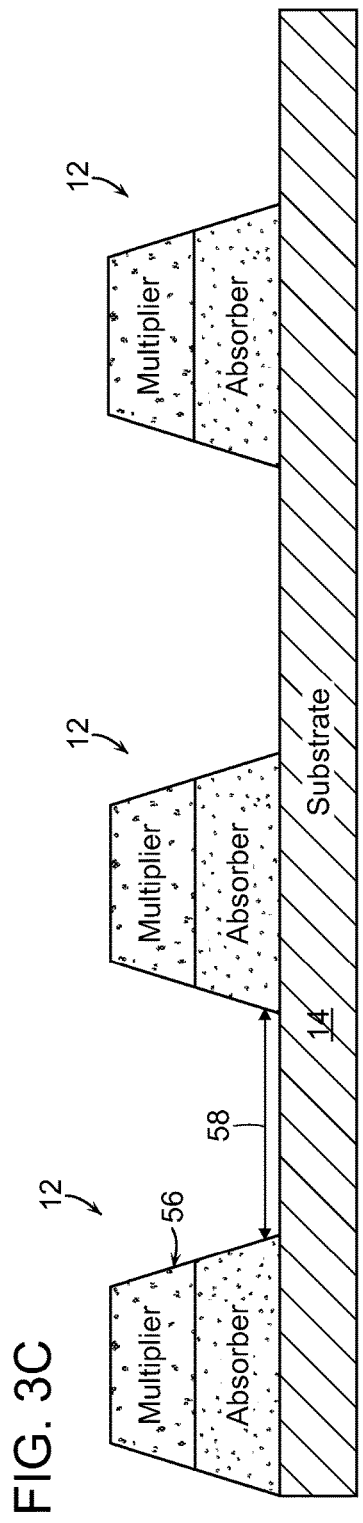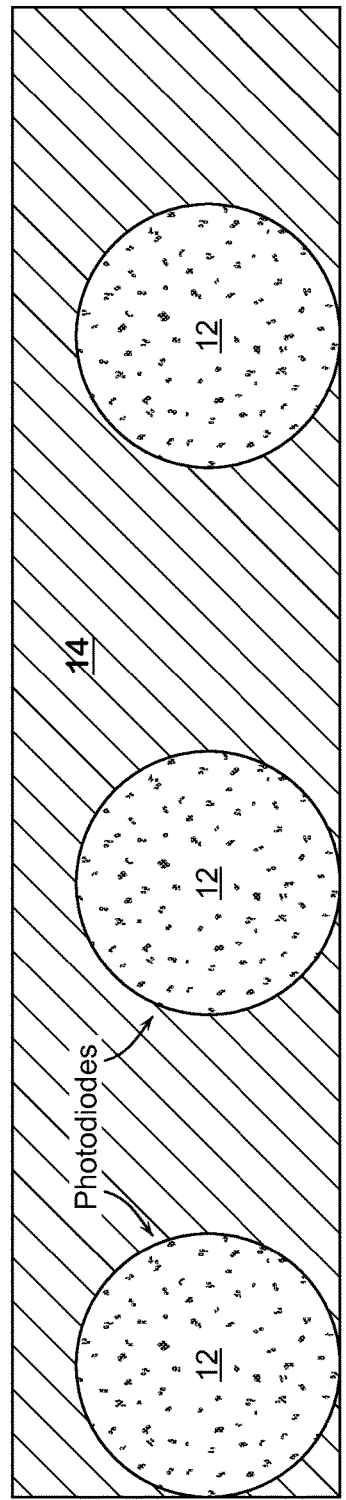

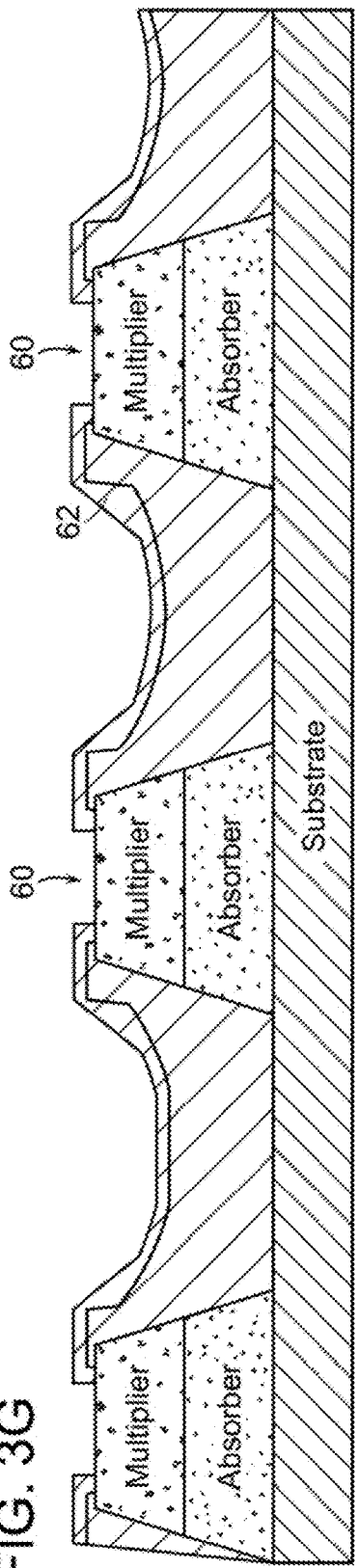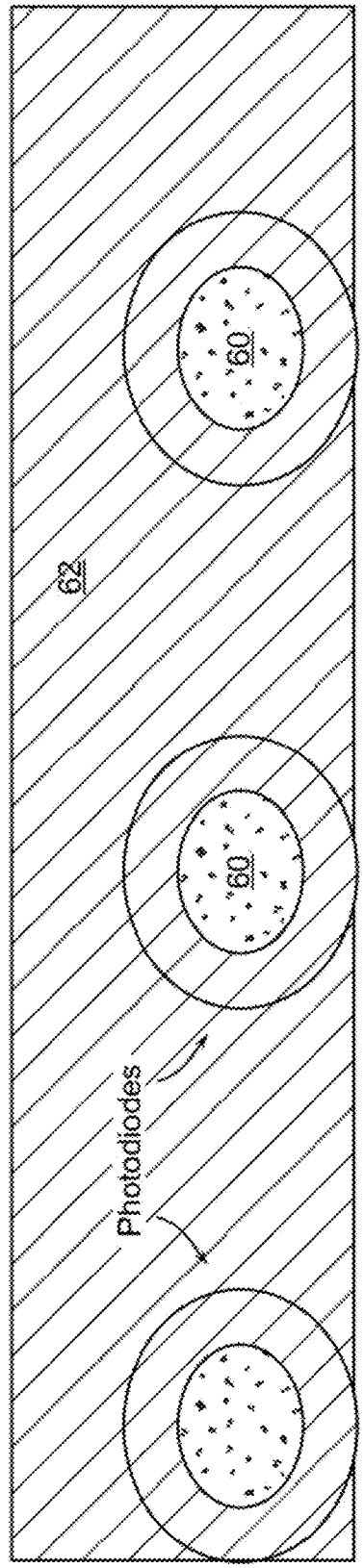

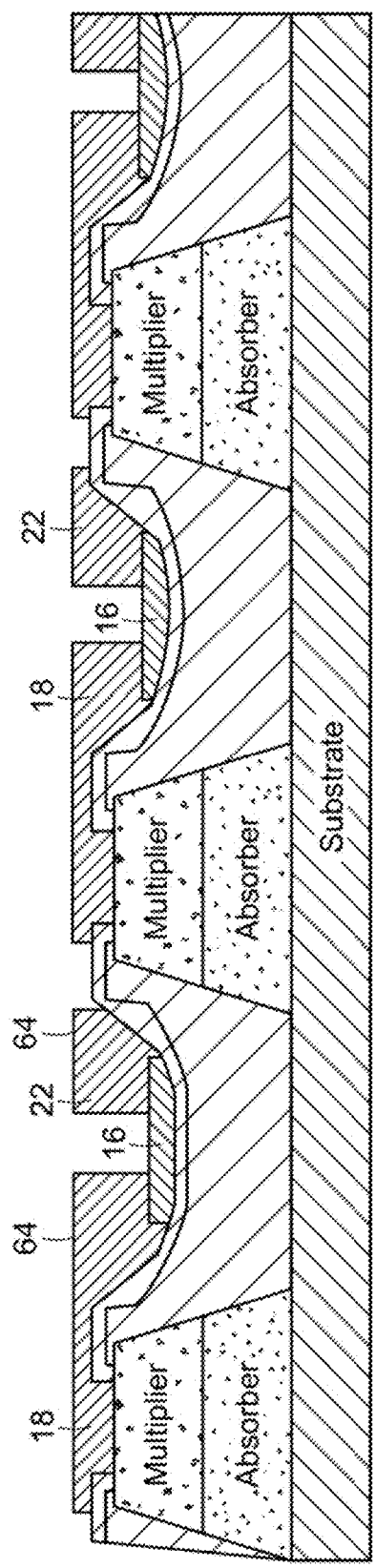
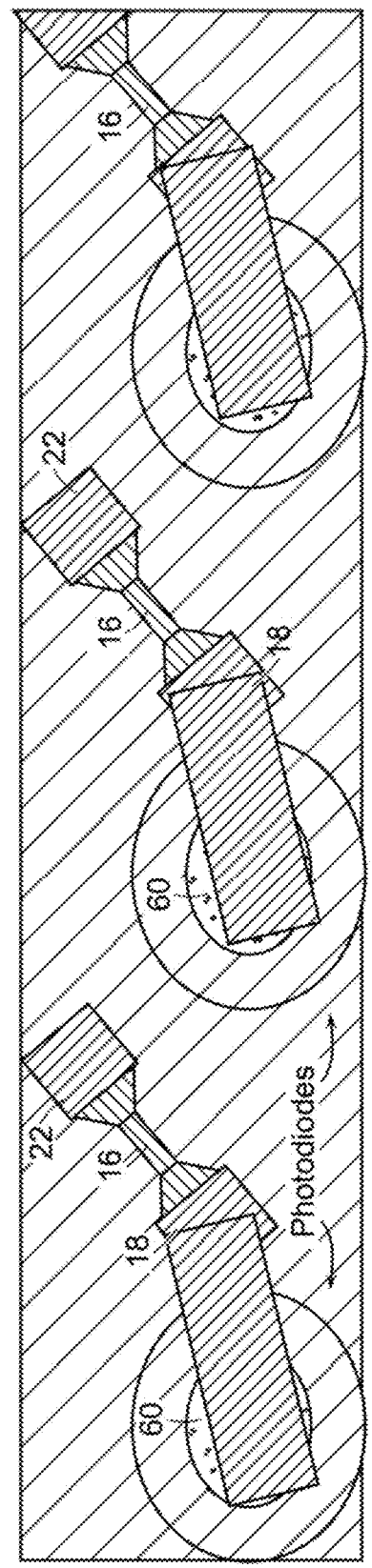
FIG. 3K
FIG. 3L

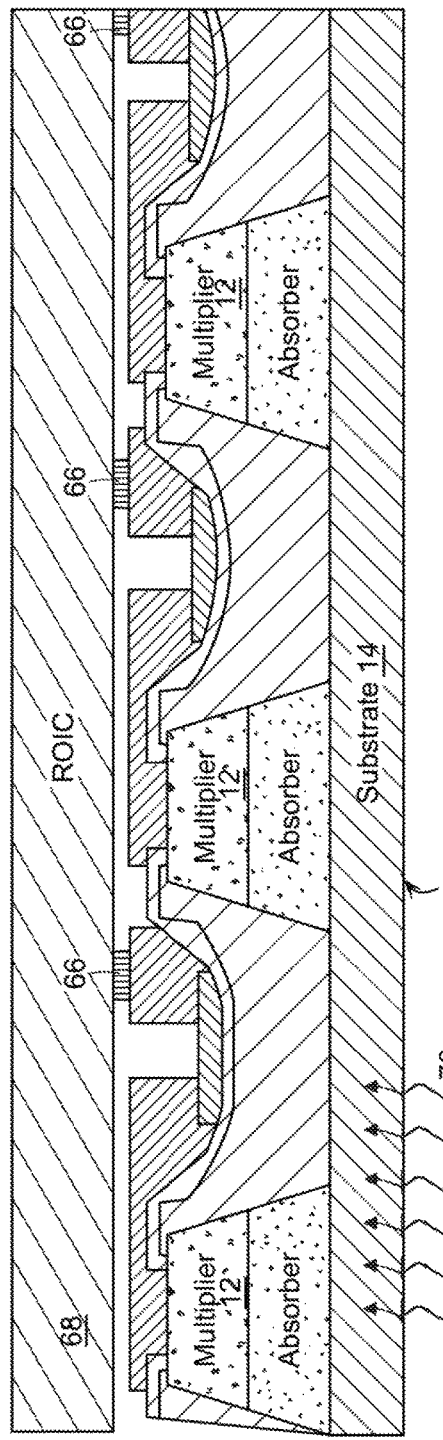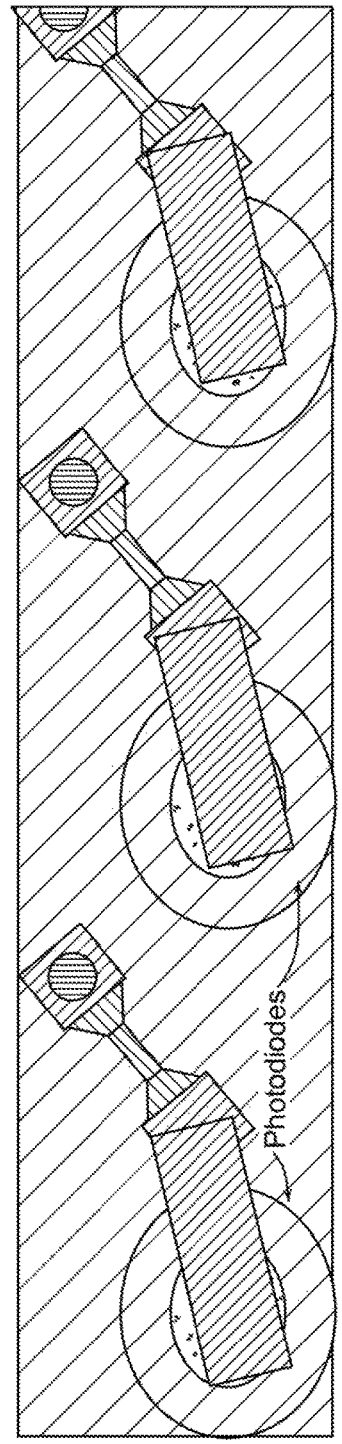
FIG. 3O
FIG. 3P

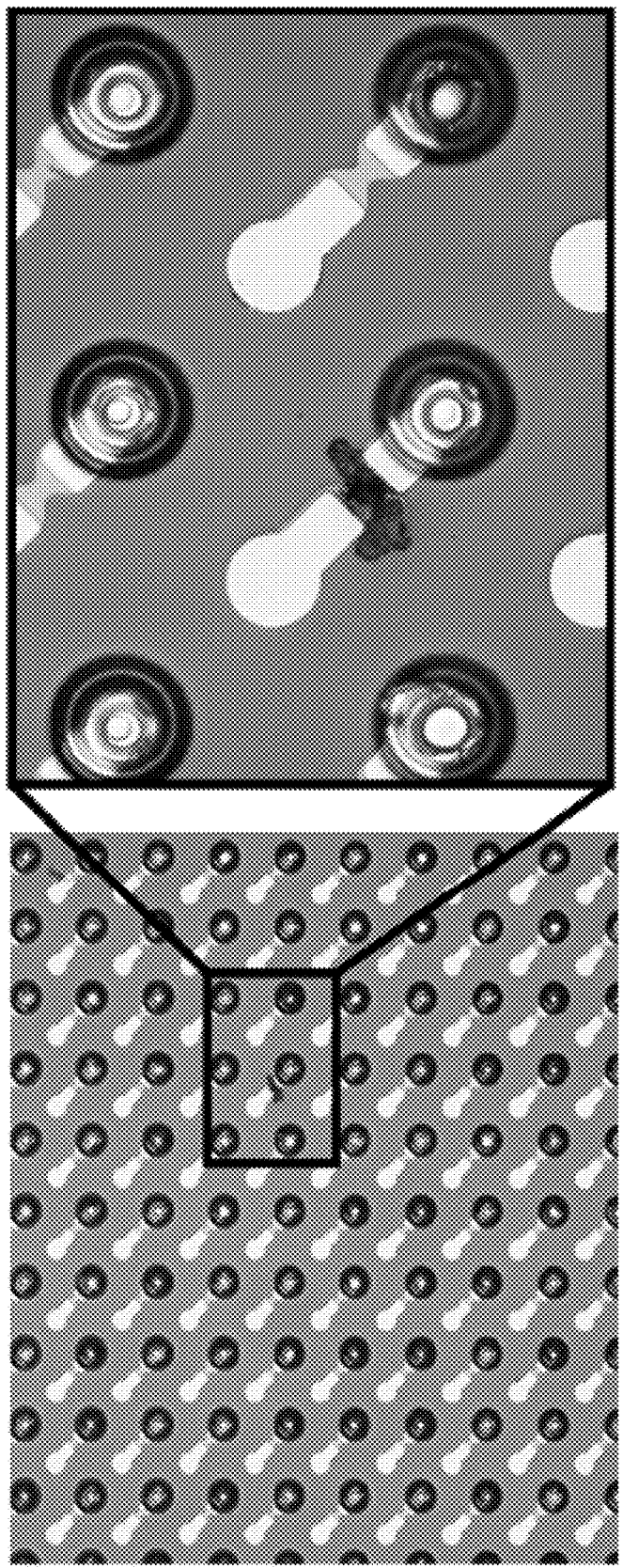

FUSE-PROTECTED ELECTRONIC PHOTODIODE ARRAY

CROSS-REFERENCE TO RELATED APPLICATION

This application claims the benefit of U.S. Provisional Application No. 62/003,661, filed May 28, 2014, the entirety of which is hereby incorporated by reference.

STATEMENT REGARDING FEDERALLY SPONSORED RESEARCH

This invention was made with Government support under Contract No. FA8721-05-C-0002, awarded by the Air Force. The Government has certain rights in the invention.

BACKGROUND

This invention relates generally to electronic photodiode devices, and more particularly relates to fuse protection in an array of photodiodes.

Arrays of electronic photodiodes, and in particular avalanche photodiode (APD) arrays, have found extensive use in a variety of photon-counting, imaging, and communications applications. When operating in so-called Geiger-mode, APDs are biased above the diode breakdown voltage; under this condition, the generation of an electron-hole pair, either through the absorption of light or through thermal generation, can cause the diode to breakdown, producing a rapid rise in electrical current. This rise in current is large enough to directly drive CMOS digital logic without the need for external signal amplification. As a result, the APD array provides highly sensitive radiation detection with microelectronic circuitry.

One challenge to successful and robust integration of a Geiger-mode APD array with an electronic readout integrated circuit (ROIC) for processing electrical signals from the array is the possibility of electrical short circuiting of one or more photodiodes in an APD array during APD operation. If an electrical short-circuited photodiode diode in the array is electrically connected to a ROIC when the short circuit occurs, the electrical short circuiting can diminish the read-out circuit performance or even catastrophically destroy the APD-ROIC assembly. In addition, an APD array as-fabricated can include one or more faulty photodiodes that are inadvertently electrically short-circuited due to a microfabrication error. In an APD array with a relatively small population of photodiodes, a small number of shorted photodiodes results in a slightly lower yield of operational APD array assemblies. But for relatively larger APD arrays including a large population of photodiodes, the likelihood of a fabrication-produced faulty photodiode in the array is relatively high and can be quite costly.

In order to minimize the likelihood that an electrically short-circuited or degraded photodiode in an APD array is electrically connected to the APD array ROIC, each photodiode in the array can be both visually and electrically prescreened after fabrication, prior to packaging, to check for defects. Following this prescreening, the electrical connection to defective photodiodes can be spot-knocked to disable electrical contact between each defective photodiode and the ROIC. While this technique is fairly effective at preventing the connection of electrically short-circuited photodiodes in APD-ROIC assemblies, there are several drawbacks associated with the device prescreening and spot-knocking process. The visual and electrical inspection of each photodiode is time consuming and limits array fabrication throughput. In addition, electrical probing of APD photodiode devices can, in and of itself, introduce damage to the APD array that is undetected prior to operation.

More importantly, however, even if careful and successful APD photodiode post-fabrication screening can be achieved, the electrical short-circuiting of photodiodes can occur during APD operation, as explained above. APD array exposure to radiation, unexpected operational voltage surges, material fatigue, and other factors can cause such short circuiting of photodiodes. Indeed any exposure of an APD array to environmental or operational conditions that produce voltages exceeding the photodiode breakdown voltage can limit photodiode performance and can damage or destroy the APD array. Without individual photodiode short circuit protection, the APD array can be rendered inoperable or catastrophically damaged.

SUMMARY

Herein is provided a photodiode array that enables short circuit protection of circuitry connected to a photodiode array. The photodiode array includes a semiconducting substrate and a plurality of photodiodes that are disposed at a surface of the substrate. Each photodiode is laterally spaced apart from neighboring photodiodes by a lateral substrate surface region. An optical interface surface of the substrate is arranged for accepting external input radiation. A plurality of electrically conducting fuses is disposed on the substrate surface. Each fuse is connected to a photodiode in the plurality of photodiodes. Each fuse is disposed at a lateral substrate surface region that is spaced apart from neighboring photodiodes in the plurality of photodiodes This photodiode array design protects read-out circuitry from damage that can occur during an electrical short circuit at one or more photodiodes in the array of photodiodes, and protects both read-out circuitry and photodiodes from damage during burn out of a photodiode fuse in response to a short circuit event at a photodiode. The fuse design and configuration enables both an increase in photodiode fabrication throughput and higher operational reliability in the production and operation of photodiode devices and systems. Other features and advantages will be apparent from the description below and accompanying figures, and from the claims.

BRIEF DESCRIPTION OF THE DRAWINGS

FIGS. 10A-10B are a plan view photomicrograph of a portion of an experimental 256×64 photodiode array integrated with a fuse array, and a magnified plan view photomicrograph, respectively, including a fuse in the array that has burned-out during a short-circuiting event.

DETAILED DESCRIPTION

Figure 1:
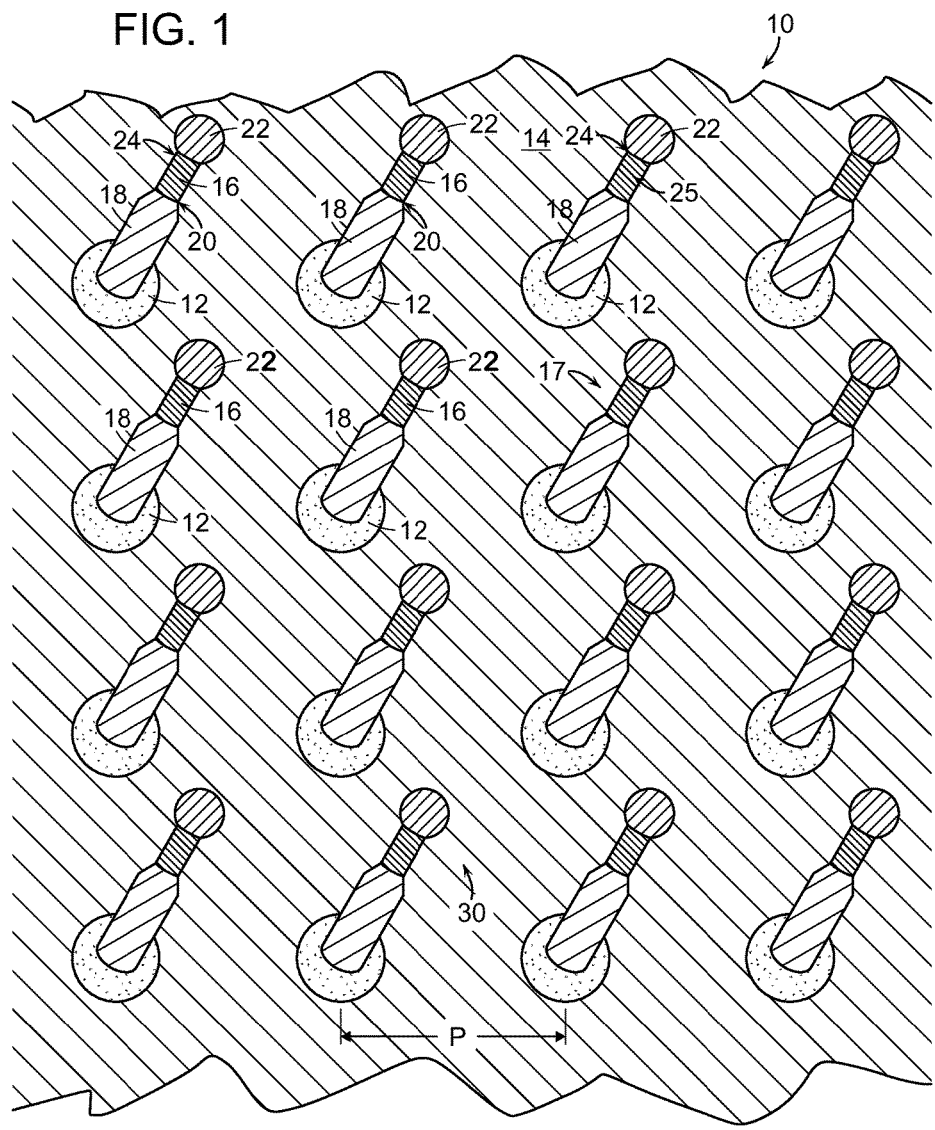
FIG. 1 is a schematic plan view of an array of photodiodes integrated with an array of fuses as provided herein, with one fuse for each photodiode and each fuse offset from each photodiode

Referring to FIG. 1 there is schematically shown a planar view of an array 10 of photodiodes 12 that are supported with a microelectronic substrate 14. The photodiodes 12 are arranged in the array 10 in a spaced apart fashion, with a photodiode pitch, P. For each photodiode in the array there is provided a fuse 16 that is disposed on the substrate 14. Each fuse 16 is located at a substrate site 17 that is laterally spaced from each photodiode 12. The photodiodes in the array are accordingly spaced with a selected pitch, P, that accommodates the location of fuses between the photodiodes. For many applications it can be preferred that the center point 25 of each fuse is arranged to lie at a substrate site that is farthest from all neighboring photodiodes. For most applications, this is typically along the diagonal between photodiodes that are arranged in a square pitch formation. But such is not in general required, and for non-square photodiode array configurations, fuses can be disposed at an suitable substrate site for each fuse can in general be accommodated.

Each fuse 16 is electrically connected to a photodiode 12 by a first electrical connection 18 that extends between the photodiode 12 and a first end of the fuse. Each fuse also includes a second electrical connection 22 extending from a second end 24 of the fuse 16 to a substrate site that is spaced from the photodiode, for electrical connection to photodiode array circuitry such as read out circuitry (ROIC). With this arrangement, an electrical connection between a given photodiode and circuitry such as a ROIC extends from the photodiode through a first electrical connection 18, through a fuse 16, and then through a second electrical connection 22. The second electrical connection 22 is in mechanical contact with an electrical connection for the ROIC, as explained in detail below. A fuse is therefore included in series with an electrical connection between each photodiode and photodiode circuitry such as a ROIC.

If the flow of electrical current from the photodiode through the first electrical connection and to the fuse is greater than a threshold electrical current that the fuse material can withstand, then the fuse material will degrade, deteriorate, burn, vaporize, or otherwise become corrupted so that fuse material becomes discontinuous at one or more sites along the fuse length and width; the path for electrical conduction through the fuse is broken. As a result, the series connection between the photodiode and the photodiode circuitry is broken. The fuse thereby operates as a protective element that disallows high electrical current levels from flowing between a photodiode and photodiode array circuitry. A separate, distinct fuse is provided for each photodiode in the photodiode array to ensure that the photodiode circuitry is protected from high current levels flowing through any photodiode in the array.

The photodiodes in FIG. 1 are shown schematically as circular in lateral geometry, but this is just one example of photodiode lateral geometry, and any suitable geometry can be employed, including square or other lateral photodiode geometry. Further, the photodiodes can each be provided in any suitable arrangement and configuration of active layers, including, e.g., a planar photodiode structure, a mesa or other raised photodiode structure, a moat photodiode structure, or other suitable arrangement of active photodiode layers. Whatever photodiode structure and vertical geometry as well as lateral geometry is employed, each fuse 16 is disposed laterally away from the active edge of each photodiode, on a substrate surface region that is between active regions of photodiodes. In other words, each fuse does not overlap with a structure of active photodiode material that operates to accept input light and generate a signal indicative of that light. The fuse is not disposed in a photodiode mesa or photodiode moat, and is not disposed on top of or under an active photodiode structure or between active photodiode layers. This condition leads to the requirement that the photodiodes be spaced apart a distance from all active photodiode materials in the array, at a substrate location between photodiodes.

In one example embodiment, circular mesa photodiodes of 12 microns in diameter are arranged in rows and columns of an array with a 20 micron pitch, with a spacing of 8 microns from the edge of one photodiode to the next, and with fuses provided between the photodiodes on the substrate. This is one general example; no particular photodiode array pitch or fuse distance is required. All that is required is that each photodiode fuse be provided laterally spaced from each photodiode, so that no fuse overlaps with photodiode structures. In general, the greater the edge-to-edge distance between photodiodes, within which distance a fuse is placed, the easier it is to microfabricate the photodiodes and fuses, and the less likely the probability for a fuse destruction to damage a neighboring photodiode. But even with very high pitch requirements, such as 1 micron-diameter photodiodes arranged with 5 micron pitch in an array of photodiodes, fuses of 2 microns wide and 2 microns long can be included on the substrate without laterally overlapping with the photodiodes.

As shown in FIG. 1, with one fuse 16 provided for each photodiode in an array 10 of photodiodes, there is provided an array 30 of fuses that is integrated with the array of photodiodes. The array 30 of fuses is laterally offset from the array 10 of photodiodes, with each photodiode in the photodiode array being connected to a distinct fuse in the fuse array. In one example embodiment, a 256×64 array of photodiodes is integrated on a substrate with a 256×64 array of fuses that is laterally offset on the substrate from the photodiode array.

With this fuse and photodiode configuration, there is no requirement that a protective passivation layer be provided over the material composition of the fuse, and it can indeed be preferred that no passivation layer be provided over the fuse material, so that at least a portion of the fuse material length is exposed. As explained above, if the electrical current flow from a photodiode to a fuse is greater than a threshold electrical current that the fuse material can withstand, then the fuse material becomes discontinuous at one or more sites along the fuse length. If a passivation layer were to be provided over the fuse material, the enclosure of the fuse material with the passivating material could lead to the formation of a reconnection of fuse material atoms under the passivating material. This reconnection could re-establish a conductive path through the fuse and re-establish electrical conductivity between the photodiode and the photodiode array circuitry, with subsequent reconnection of the shorted circuit and possible damage to the circuitry unless/until the fuse material again disconnects. It is therefore preferred that no passivation layer be provided over the fuse material.

This exclusion of passivating material over the fuse material renders the fuse material substantially exposed and results in the exposure of photodiodes to the destruction of the fuse during a short circuiting event. The lateral spacing of fuses away from photodiodes in the manner shown in FIG. 1 aids in protecting photodiodes from fuse destruction. In addition, if the fuses are disposed at sites on the substrate surface at which there is substantially no topology, and if the photodiode structures extend vertically from the substrate, as in a mesa photodiode configuration, then the lateral spacing of fuses away from photodiodes also vertically spaces the fuses away from photodiodes. In one embodiment, the fuses are configured as planar lengths of fuse material. Thus, both lateral and vertical separation of fuses from photodiodes can be employed to protect photodiodes from fuse destruction during a short circuiting event. But in general, it is not required that the fuses be sited on a flat substrate surface away from photodiodes. The fuses can be sited on a sloping surface or other topology that supports the fuse material. Further, the electrical connection between the photodiode and the fuse material can overlap with the photodiode, and can be non-planar in extending from, e.g., the top of a photodiode to one end of a fuse. It is the fuse material itself that is laterally separated from the photodiode.

Figure 2A:
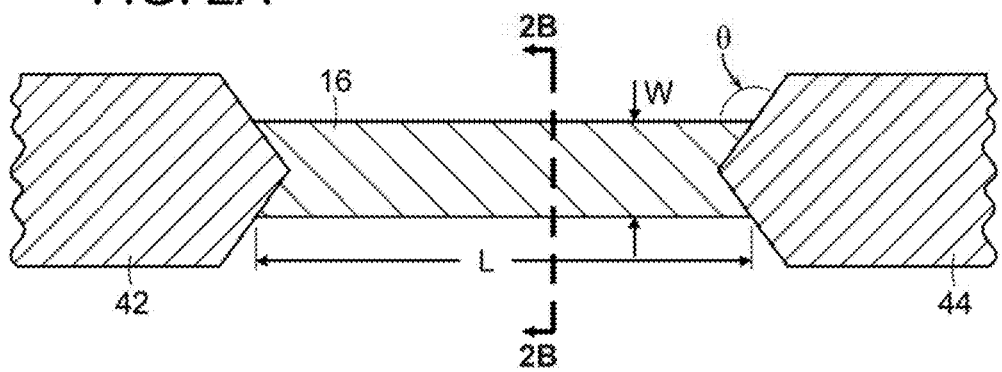
FIGS. 2A-2B are schematic plan and cross-sectional views, respectively, of an example fuse embodiment provided herein.
Figure 2B:
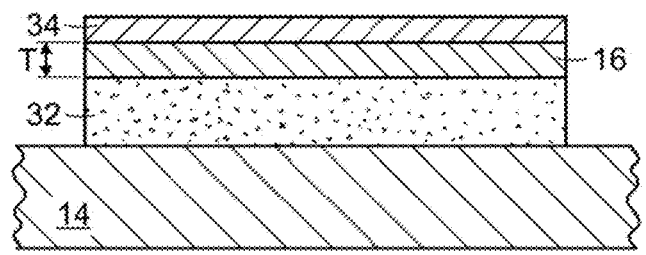

The fuse material composition, fuse material thickness, and lateral fuse geometry are determined based on the operational and performance specifications for a given photodiode array application. Referring to FIGS. 2A-2B, there can be provided with the fuse material a plurality of additional layers each with a specific function. Hereinafter, the term fuse material will refer to an electrically conducting material and any accompanying upper or lower material layers that aid in the formation and operation of the fuse. The electrically conducting fuse material layer 16 can be provided as any suitable electrically conducting material, e.g., aluminum, gold, platinum, silver, nickel, silicon, germanium, molybdenum, a nitride, or other suitable electrically conducting material. This electrically conducting fuse material 16 can sandwiched between any number of other materials or employed without other adjacent materials. For example, a lower adhesion layer 32, of, e.g., Ti, can be included to aid in robust adhesion of the fuse material to the underlying substrate material. The substrate surface can be provided with any selected surface composition or layers of materials on the surface. An anti-oxidation layer 34, e.g., of nickel, molybdenum, gold, platinum, silicon, germanium, or other suitable material, can be included on top of the fuse material for preventing oxidation of the electrically conducting fuse material layer. The anti-oxidation and adhesion layers can be expected to be vaporized or otherwise destroyed during an electrical short circuiting event. These layers are not passivating layers, and because these layers are destroyed with the fuse material during an electrical short circuiting event, these layers do not promote reconnection of fuse material atoms after a short circuiting event.

The fuse material thickness, T, length, L, and width, W, are selected to cause the fuse material to become discontinuous at one or more sites along the length of the fuse material when an electrical current above a specified threshold short circuiting electrical current is conducted through the fuse material. The fuse material may be burned, vaporized, or otherwise degraded or destroyed by an electrical current flow that is greater than the specified threshold short circuiting electrical current. Fuse material thickness is preferably selected based on a desired 'burn-out' current and in one embodiment, can range in thickness between, e.g., about 10 Å to about 100 microns. An adhesion layer can be provided of a selected material and a thickness of between about, e.g., 20 Å and 200 Å. An anti-oxidation layer can be provided with a suitable thickness of, e.g., between about 20 Å and about 500 Å. In one example embodiment, given a specified electrical short circuiting level of electrical current through the fuse material of about 4.5 mA, then a Ni anti-oxidation layer of about 20 Å in thickness, an Al fuse layer of about 75 Å in thickness, and a Ti adhesion layer of about 20 Å in thickness are employed. The short circuiting current level that causes deterioration, or burn-out, of a fuse, is generally independent of applied voltage, and here for example, is between about 75 V and 100 V.

As shown in FIG. 2B, the fuse length and geometry are likewise selected based on desired fuse operation. It can be preferred to experimentally test various fuse geometries to determine a geometry that is not generally prone to reconnection of fuse material after a short circuiting event. It is found that relatively longer fuse lengths can be less likely to promote fuse material reconnection, but that above some threshold length, no further advantage is achieved and more lateral substrate space is required. There is thus, in general, a range of fuse lengths that support optimal fuse operation while minimizing required substrate space. In one example, a fuse length of between about 2 microns and about 8 microns and a fuse width of between about 1 micron and about 2 microns can be employed. As shown in the figure, there is provided a contact pad 42, 44, at each end of the fuse length, for making the electrical connections between the fuse and the photodiode and array circuitry shown in FIG. 1. The contact pads 42, 44 can be rectangular or other suitable lateral geometry.

The microelectronic fuse geometry provided herein can be integrated into any suitable photodiode platform, substrate, or other photodiode array structure for which fuses are desired. Further, the photodiode array can be customized, e.g., by including structures and materials for reducing cross-talk between neighboring photodiodes in the array. Other microfabrication features as well as system features can be included, e.g., such as a microlens array or other structural feature, as described in U.S. Patent Application Publication 2011/0169117, published Jul. 14, 2011, the entirety of which is hereby incorporated by reference.

Figure 3A:
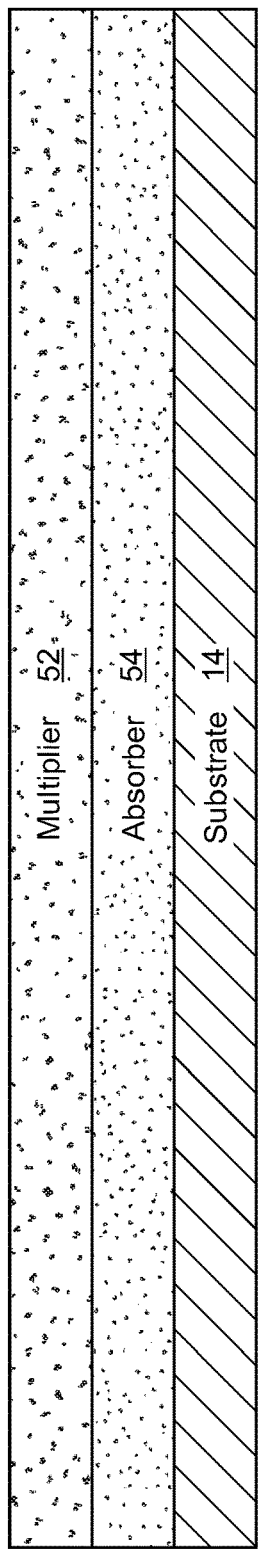
FIGS. 3A-3P are alternating plan and cross-sectional views of an example microfabrication sequence for producing the arrays of photodiodes and fuses of FIG. 1.
Figure 3B:
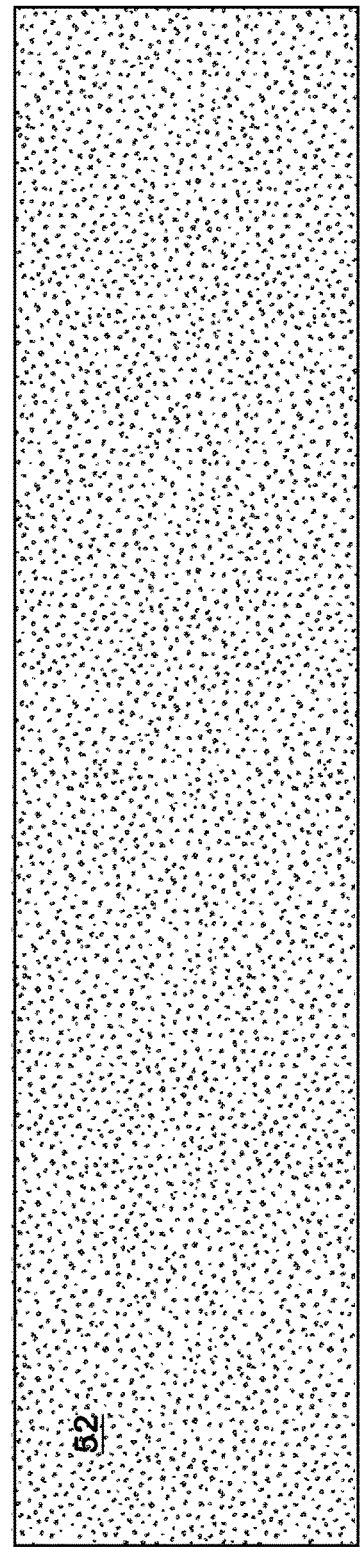

Referring to FIGS. 3A-3P, in the fabrication of an example photodiode array including a fuse structure for each photodiode in the array, there are first configured the photodiode active regions. This particular example photodiode fabrication sequence is not required and any suitable microfabrication process and materials can be employed. In this example, as shown in FIG. 3A, first a layer 52 of material operating as an avalanche photodiode multiplier region is disposed atop a layer of material 54 operating as an avalanche photodiode absorber region, on a selected substrate 14. FIG. 3B is a planar view of the structure. Referring to FIG. 3C, in one example photodiode configuration, each photodiode 12 is fabricated as a mesa structure 56 that is separated from each neighboring photodiode by an expanse 58 of substrate. To produce this configuration, the active photodiode layers, e.g., multiplier and absorber layers, 52, 54, are patterned and etched to form for each photodiode a mesa structure 56. A lateral region 58 of substrate surface, having no topology thereon, is provided between each photodiode and separates each photodiode from the other photodiodes in the array. Each mesa photodiode is in this exampled formed with a generally circular mesa structure, as shown in the plan view of FIG. 3D.

Figure 3E:
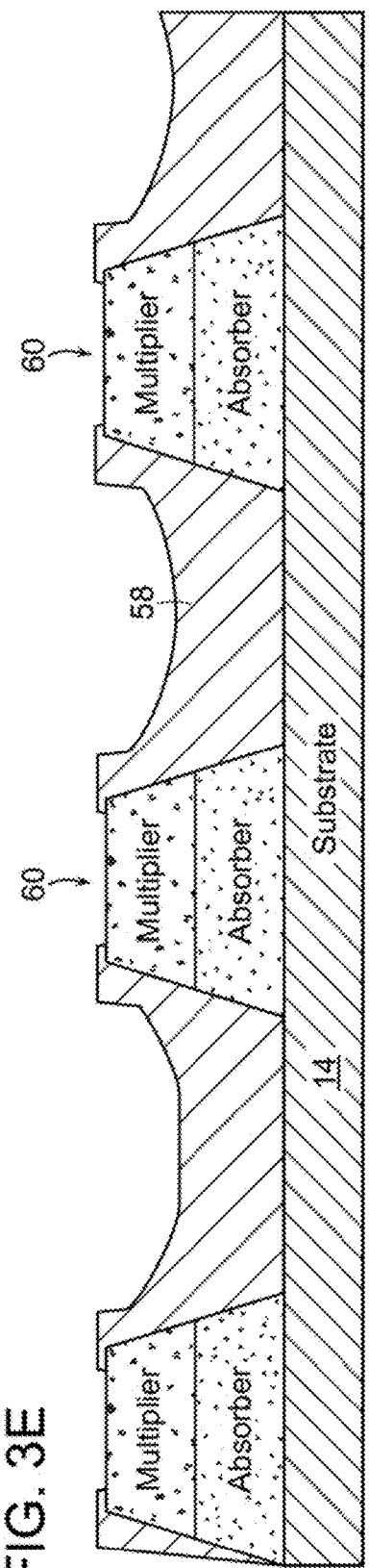
Figure 3F:
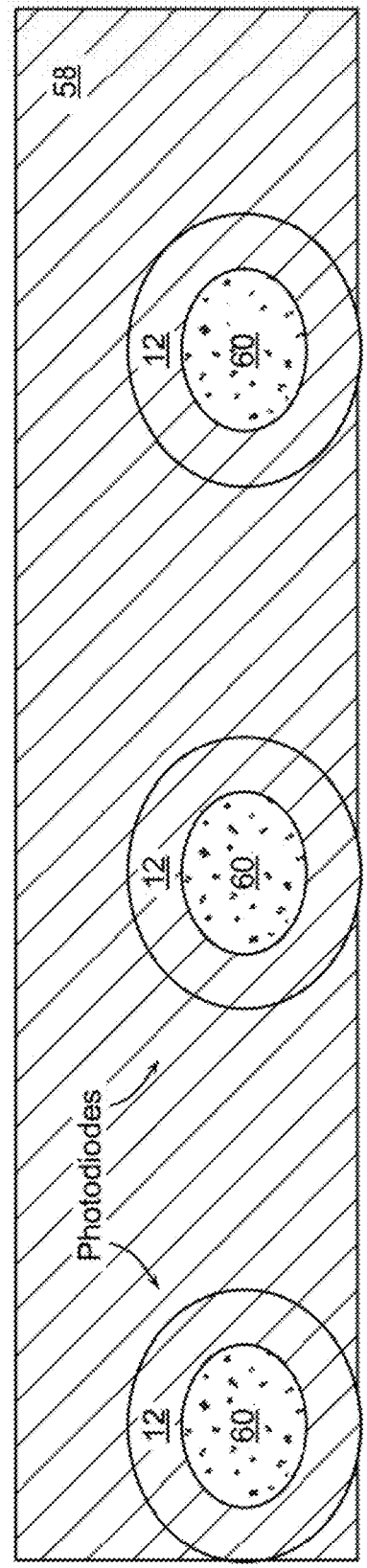

Referring to FIGS. 3E-3F, in a next fabrication step, a layer 58 of passivating material, such as polyimide, is formed on the exposed substrate regions and on the photodiode mesas. The polyimide layer is patterned and etched to expose a region 60 each photodiode, e.g., the top surface of the multiplier layer on each photodiode mesa. As shown in FIGS. 3G-3H, a further passivation and capping layer 62 can be formed on the passivating layer 58. For example, a layer of $SiN_x$ or other suitable capping layer can be deposited and then patterned and etched to expose the a region 60 of each photodiode, such as the multiplier layer 52 on each photodiode mesa 56.

Figure 3I:
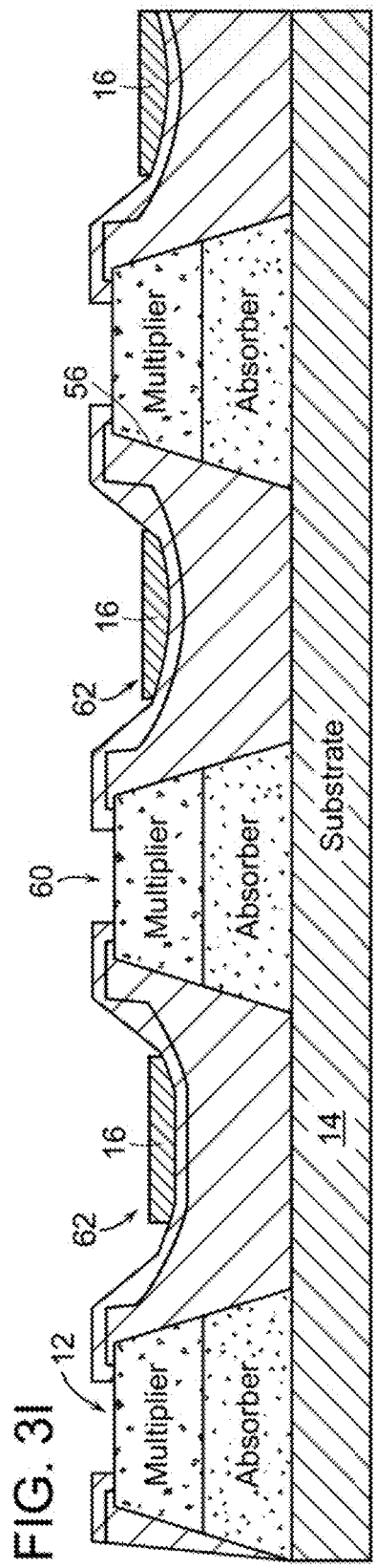
Figure 3J:
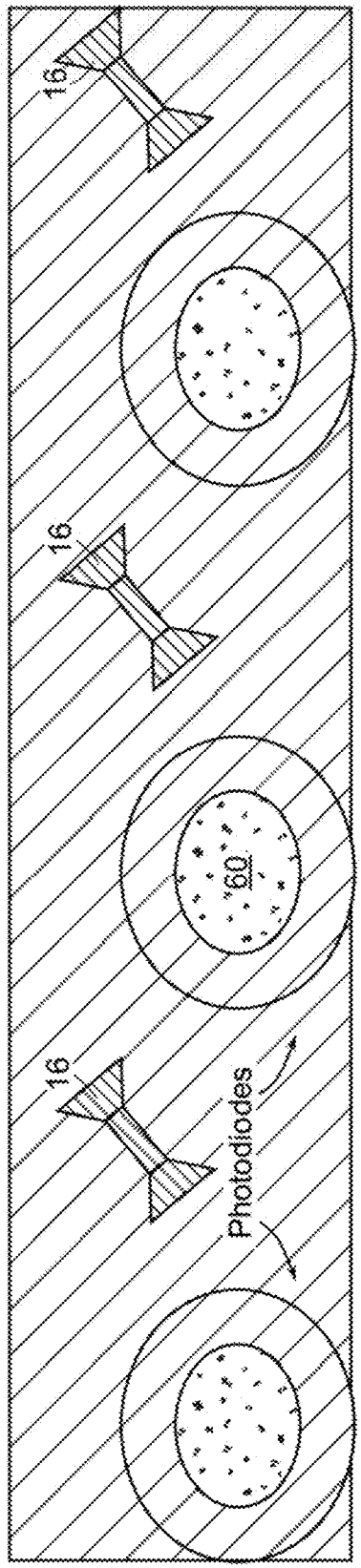

Referring to FIGS. 3I-3J, a layer of fuse material 62 is then deposited, patterned, and etched. The fuse material can be formed in the manner described above, and can include a lower adhesion layer and an upper anti-oxidation layer if desired. The resulting fuse 16 for a given photodiode 12 is located on the substrate region in the vicinity of the photodiode but distanced from the photodiode. The fuse material 62 is not located on a photodiode active region or high field region and does not laterally overlap with a photodiode. The fuse for each photodiode is accordingly provided on the substrate 14, away from the photodiode mesa 56, as shown in FIG. 34J.

Referring to FIGS. 3K-3L, with an array of fuses thusly formed, a contact metal layer 64 is deposited, patterned, and etched to form a first electrical connection, 18 between a photodiode and a fuse 16, and a second electrical connection 22 for electrically connecting a fuse 16 with the photodiode diode array circuitry. The first electrical connection 18 extends from the exposed surface 60 of a photodiode to a first end of a fuse 16. The second electrical connection 22 extends from the second end of the fuse to a location for formation of an electrical contact to the photodiode array circuitry. The first and second electrical connections form the series connection between a photodiode and a fuse for connection in series with the photodiode array circuitry.

Figure 3M:
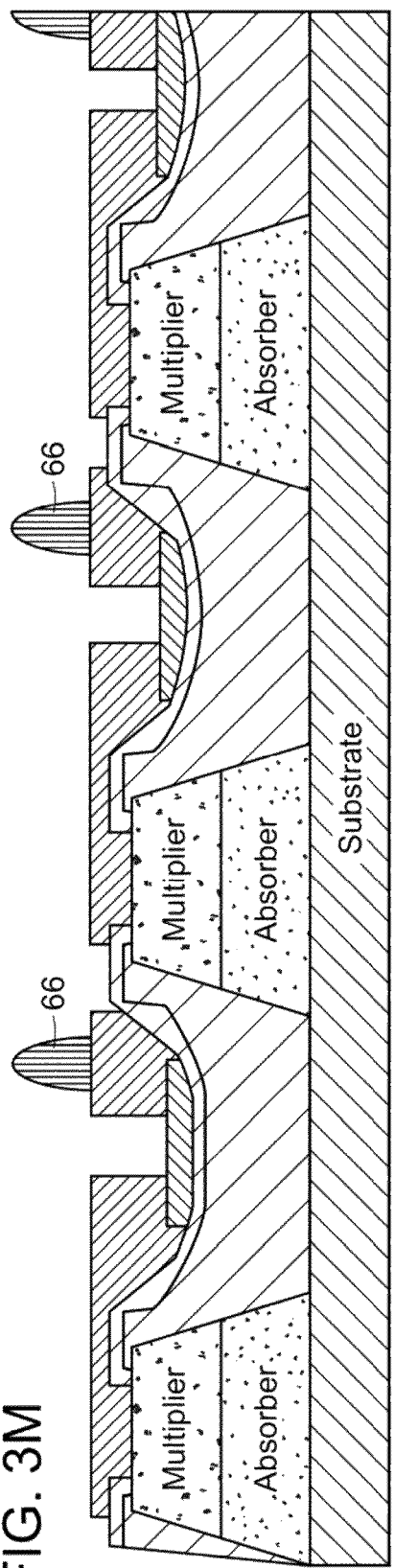
Figure 3N:
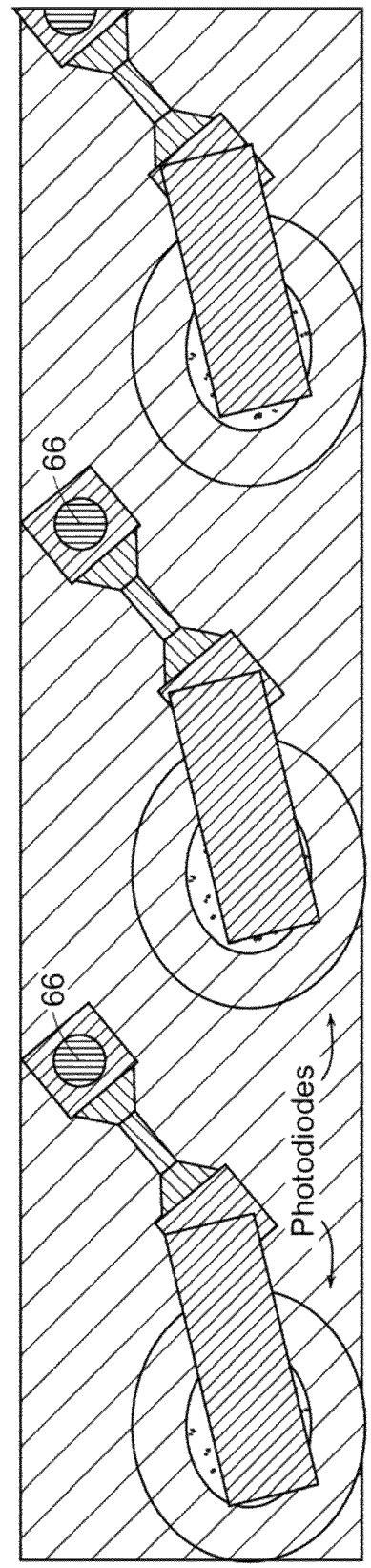

As shown in FIGS. 3M-3N, an electrical connection, such as an electrically conducting bump 66 of electrically conductive material, is then formed at the second fuse electrical connection 22 for making electrical contact between the fuse and the photodiode array circuitry. The electrically conducting bump 66 or other contact material, is preferably disposed at the second fuse end, opposite the photodiode end of the fuse, and away from the photodiode. Then as shown in FIGS. 3O-3P, the photodiode array circuitry, such as read-out integrated circuitry ROIC provided by a ROIC substrate 68, is connected to the array of electrically conducting contacts, such as conducting bumps 66, to complete the series connection between each photodiode to the ROIC through a fuse 16. FIGS. 3O-3P schematically represent a completed photodiode array that is integrated with an array of fuses, with each fuse connected in series between a photodiode and the read-out circuitry substrate 68 for the photodiode array. The back side of the substrate 14 is arranged as an optical interface surface 70 that accepts external input radiation 72 for the photodiodes 12 on the opposite side if the substrate 14.

As shown in FIG. 3O, with this arrangement, the surface of the ROIC 68 is vertically separated from the array of fuses. For many implementations, the ROIC is in this configuration separated from the exposed upper surface of the fuses 12 by at least about 1 micron. As a result, the destruction of fuse material during an electrical short circuiting event is distant from the ROIC. This destruction of fuse material can result in material vaporization, melting, combusting, or otherwise deteriorating of the fuse material. Atoms of fuse material can subsequently move around the surface of the substrate as well as enter the gas phase and deposit on adjacent surfaces. By positioning the fuses at the substrate level, rather than on the photodiodes, and by positioning the fuses laterally away from the photodiodes, the fuses are maintained at a distance from both the photodiodes and the ROIC that minimizes damage to both the photodiodes and the ROIC during fuse material destruction. As one or more fuses "burn-out" during short circuiting events in the course of operation of the photodiode array, the integrity of the photodiode array as well as the ROIC is maintained, and operation of the photodiode array is not interrupted.

EXPERIMENTAL EXAMPLE I

Microelectronic fuses having a range of geometries were microfabricated. Electrical short circuiting events for which the fuses were to operate by breakage of fusing electrical connectivity were defined with a threshold short circuiting current of about $4.5 \times 10^{-3}$ A. A maximum leakage current to be conducted through a burned-out fuse length was specified as about $10^{-7}$ A at a voltage of about 70 V. The experimental fuse geometry was specified to accommodate a photodiode array pitch as small as 20 µm. Both fuse material and fuse dimensions of length, width, and neck angle, $\theta$, as shown in FIG. 2A, between the fuse length and the adjacent contact pads 42, 44, were experimentally investigated.

Fuses were microfabricated by first spin-coating on InP substrates a 2 µm-thick layer of polyimide, which was then cured at 220° C. for 1 hour in a nitrogen environment. The polyimide layer was then coated with a 2000 Å-thick layer of $SiN_x$ that was deposited at 300° C. in a plasma-enhanced chemical vapor deposition system. Single-layer fuse structures having various dimensions were then defined using conventional photolithography and electron-beam deposition. The deposition was performed in a dual shutter electron-beam evaporation system in which the deposition rate could be measured prior to opening the second shutter for metallization of the sample. The deposition rate of the fuse metal layers was 1 Å/s. The rate was monitored using a standard quartz crystal. The final fabrication step was a second photolithography process followed by electron beam deposition of 100 µm×100 µm Ti/Au (200 Å/2000 Å) square contact pads on both ends of the fuse to be used for electrical probing.

The fuse structures had fuse lengths that varied between 2 µm and 20 µm in 2 µm increments. For each fuse length, fuses were fabricated with widths varying from 2 µm-20 µm in 2 µm increments. For each fuse length-width combination, fuse neck angles of 90°, 110°, 135°, and 160° were fabricated The fuses were fabricated with thicknesses ranging from between about 10 Å-250 Å. Fuses were fabricated of the electrically conducting materials Ti, Au, Pt, Al, S, Ni, and Ge.

Figure 4:
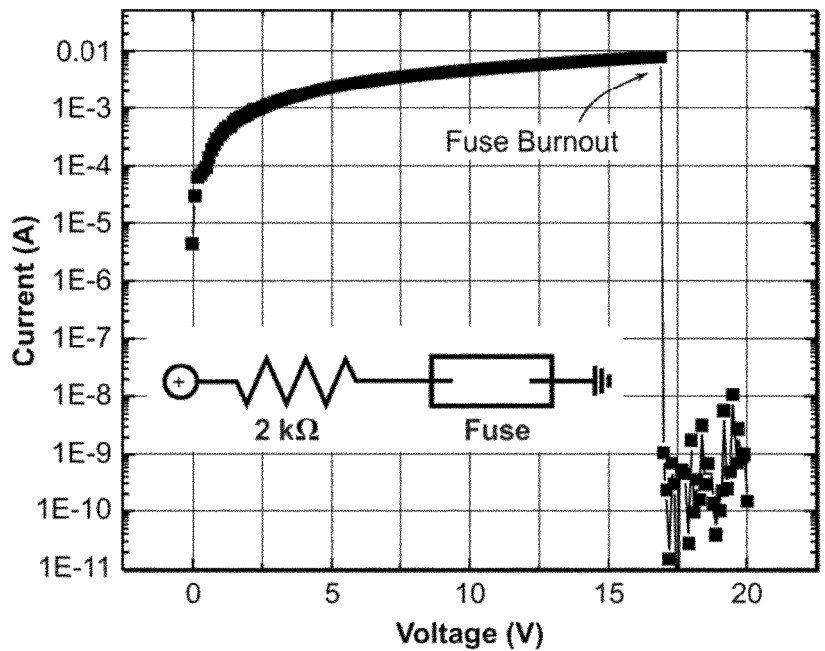
FIG. 4 is a plot of measured fuse burn-out current as a function of voltage applied across an aluminum fuse with a length of 2 microns and a width of two microns.

The electrical current at which each fuse deteriorated or 'burned out' was determined by performing voltage sweeps across each fuse using 0.1 V, 200 ms steps in voltage while measuring the electrical current through a fuse. Each fuse was configured in the test circuit in series with a 2 kΩ resistor. The burn-out current was defined as the highest current reached before an order of magnitude drop in current was measured. FIG. 4 is a plot of measured current through a fuse as a function of voltage applied across a fuse, for a fuse including a fuse material of aluminum of 100 Å in thickness and having a length of 2 μm and a width of 2 μm.

In analyzing the various experimental fuse materials, it was found that a fuse thickness of about 100 Å formed of aluminum produced fuses with the desired burn-out currents, on the order of 5-10 mA, and leakage currents through burned-out fuses of less than about $10^{-7}$ A after burnout. In addition, it was observed that test fuses with 135° neck angles and lengths longer than 4 μm were the least likely to have burn-out events away from the center of the fuse, near the bond pads.

EXPERIMENTAL EXAMPLE II

Based on the results of the first experiments, a second set of experiments was carried out to refine the performance of Al-based fuses. The goal of these experiments was to better understand the burn-out current of the fuses as a function of length and width as well as to optimize fabrication compatibility with photodiode array fabrication. The fuse structures had fuse lengths that varied between 2 μm and 20 μm in 2 μm increments. For each fuse length, fuses were fabricated with widths varying from 2 μm-20 μm in 2 μm increments. For each fuse length-width combination, fuse neck angles of 135° and 142° were fabricated. The fuses were fabricated with thicknesses ranging from between about 10 Å-250 Å. Fuses were fabricated of the electrically conducting material Al in the manner of Example I. Adhesion and oxidation prevention metal layers were here also added to the fuse test structures. The lower-most layer was a 20 Å-thick Ti layer deposited on the substrate to provide adhesion. The second layer, the active fuse material, was an Al layer. The thickness of this layer was varied to adjust the burn-out current. The upper layer was a Ni layer used to prevent oxidation of the Al layer beneath it. 20 Å and 50 Å Ni layers were produced. In addition, fuse structures having neck angles of either 135° or 1.42° were produced.

Figure 5:
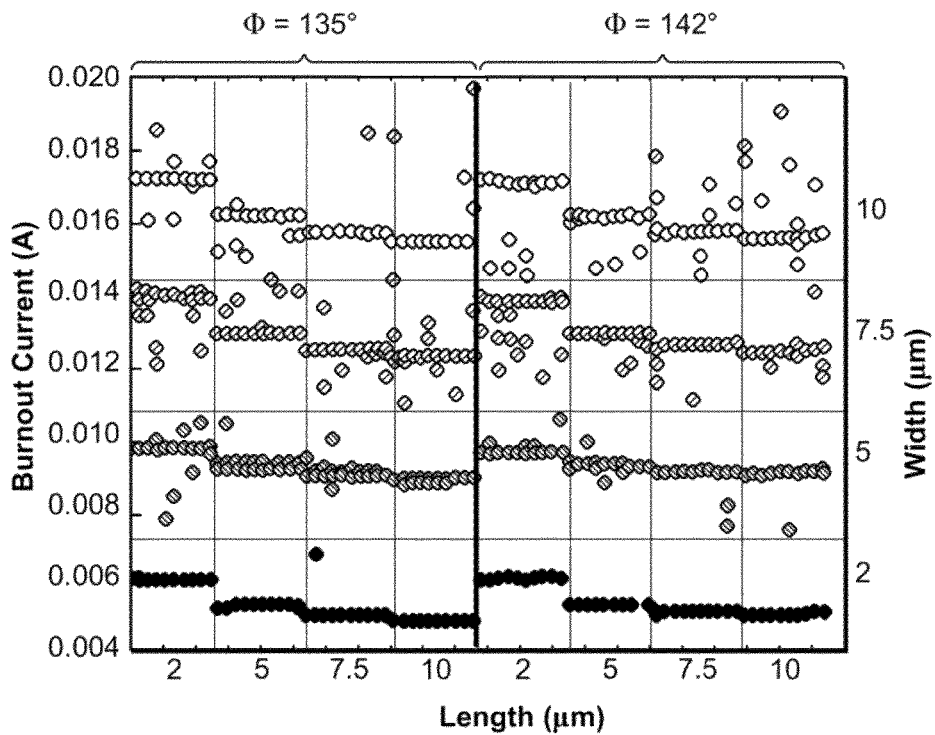
FIG. 5 is a plot of fuse burn-out current as a function of fuse length for fuse widths and for fuse neck angles of 135° and 142°.
Figure 9:
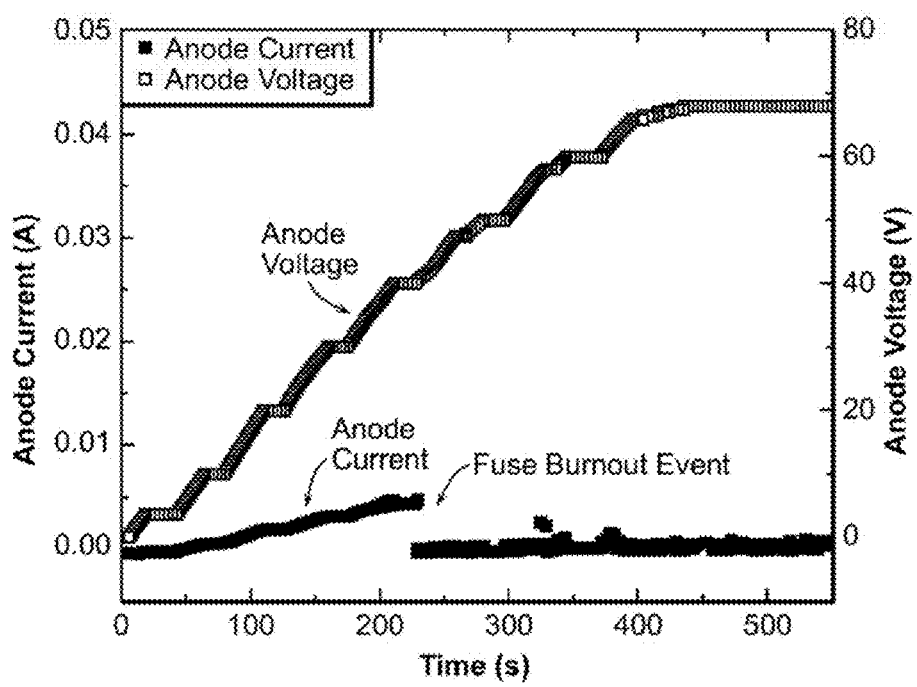
FIG. 9 is a plot of photodiode anode current as a function of time for a 256×64 array of avalanche photodiodes incorporating a 256×64 array of fuses, indicating a fuse burn-out event during photodiode array operation.

Each of the microfabricated fuses was subjected to electrical current flow using an automated probing station, again in series with a 2 kΩ resistor in the testing procedure of Example I. FIG. 5 is a plot of burn-out current as well as fuse width as a function of fuse length, for the two fuse neck angles of 135° and 142°, and for the two nickel layer thicknesses. As shown in the plots of FIG. 9, fuses having an upper 50 Å-thick Ni layer showed more scatter in the burn-out data than those having a 20 Å-thick nickel layer. The fuses having a 135° neck angle could withstand a slightly lower burn-out current than those with a 142° neck angle.

EXPERIMENTAL EXAMPLE III

Figure 6:
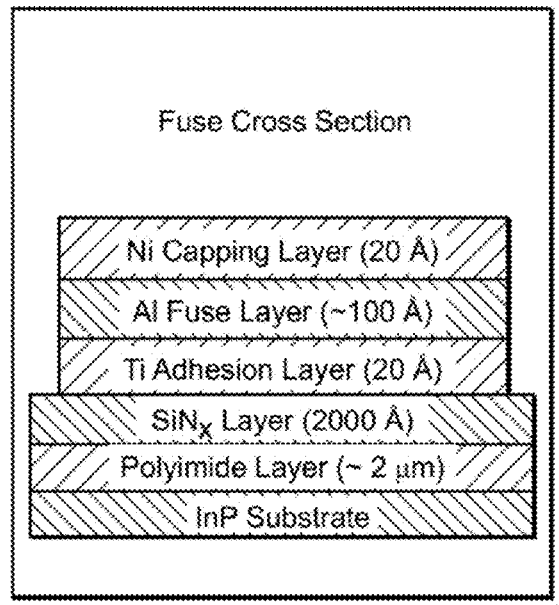
FIG. 6 is a schematic cross-sectional view of an experimental fuse material configuration.

A third set of experiments was carried out to refine the fuse burn-out current characteristics for a fuse of aluminum and including a lower Ti adhesion layer and an upper Ni oxidation resistance layer as in FIG. 2B. The goal of these experiments was to understand the burn-out current as a function of length, width, and Al thickness. The fuses were fabricated following the fabrication procedure of Examples I-II. Aluminum, fuse material thicknesses of 50 Å, 75 Å and 100 Å were produced. A 20 Å-thick Ni oxidation resistance layer was here employed, with a 20 Å-thick Ti adhesion layer, for all fuses, as shown in FIG. 6. All fuses were microfabricated with a fuse neck angle of 135°. Fuses from 2 to 8 μm in length fabricated, with both 2 μm and 4 μm fuse widths. The fuse length and widths were measured using a microscope with a measuring reticle.

Figure 7:
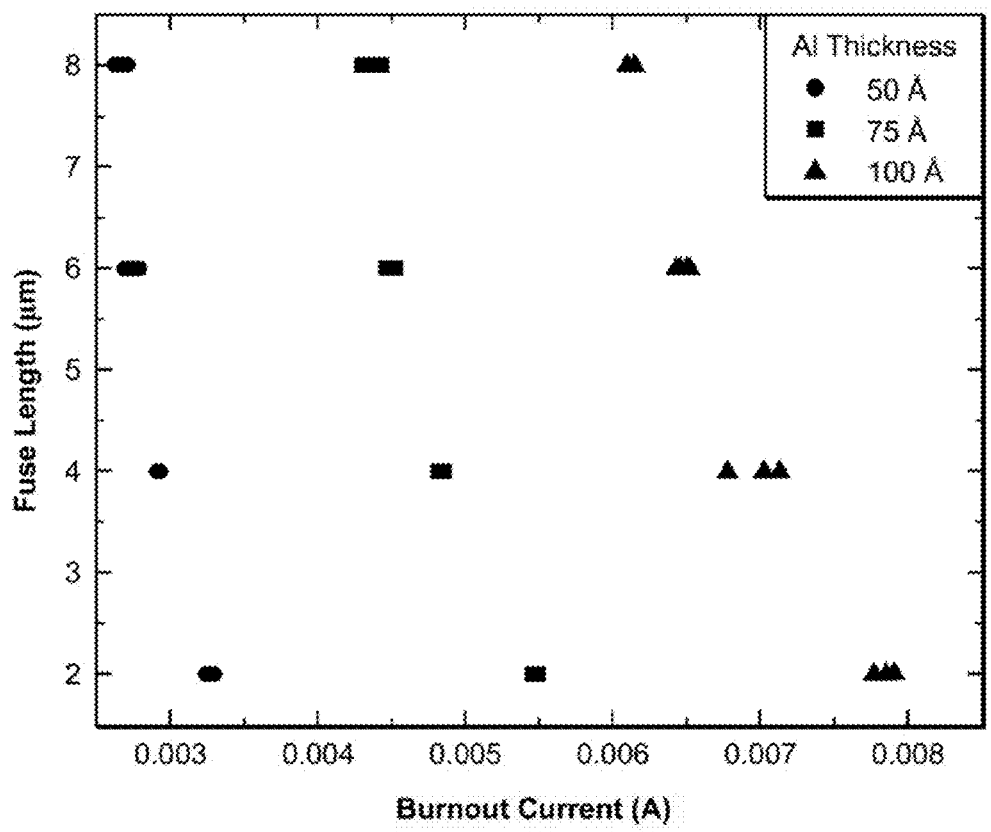
FIG. 7 is a plot of fuse length as a function of fuse burn-out current for aluminum fuses of 2 microns in width and for fuse thicknesses of 50 Å, 75 Å, and 100 Å.
Figure 8:
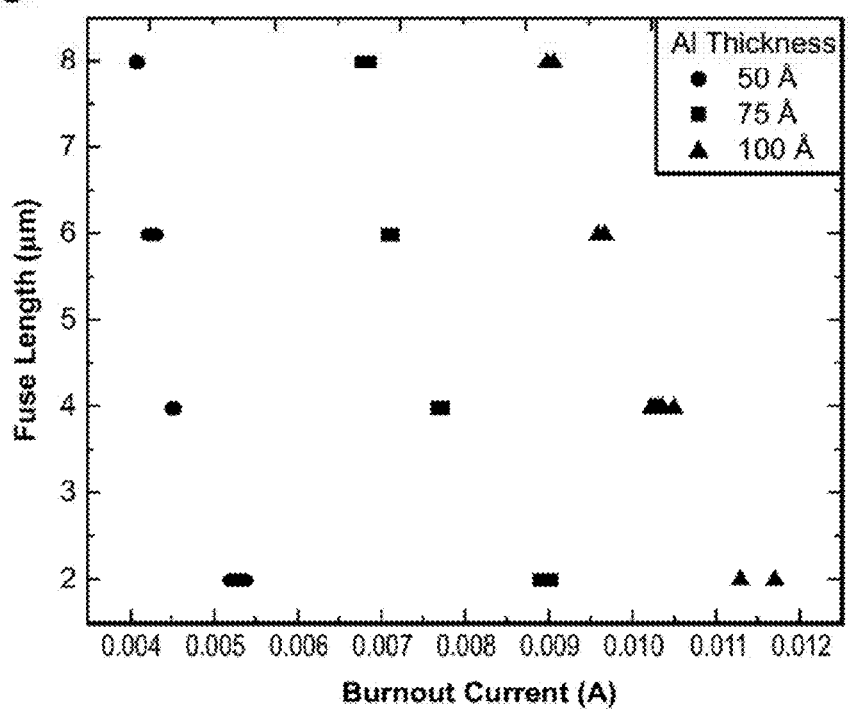
FIG. 8 is a plot of fuse length as a function of fuse burn-out current for aluminum fuses of 4 microns in width and for fuse thicknesses of 50 Å, 75 Å, and 100 Å.

Using the testing procedure of Example I, the burn-out currents of the microfabricated fuses were measured by sweeping the voltage across the fuses from 0 V to 70 V using 0.1 V, 500 ms steps, while measuring the electrical current through the test circuit. The fuses were here configured in series with a 2 kΩ resistor as in Examples I-II. For each fuse length-thickness combination, five data points were measured. FIG. 7 is a plot of fuse length as a function of fuse burn-out current for the 2 μm-wide fuses, and for the three aluminum thicknesses. FIG. 8 is a plot of fuse length as a function of fuse burn-out current for the 4 μm-wide fuses, and for the three aluminum thicknesses.

EXPERIMENTAL EXAMPLE IV

With a minimum fuse burn-out electrical current specified as $4.5 \times 10^{-3}$ A, 8 μm-long and 2 μm-wide aluminum fuses were incorporated into a 256×64 pixel InP-based Geiger-mode APD array following the microfabrication procedure described above. The photodiodes of the array were configured with a 50 μm pitch. The fuses were fabricated including a 20 Å-thick titanium adhesion layer and a 20 Å-thick nickel anti-oxidation layer.

Without prescreening for defective photodiodes, the fuse-protected APD array was bump-bonded to a ROIC for operation of the APD array. The photodiode array was controlled with the ROIC to electrically bias each photodiode in the array. First, the voltage bias of the array was slowly increased from 0 V to an operating voltage of about 68 V. FIG. 9 is a plot of the both the anode current and the anode voltage as a function of time as the voltage was increased. At about 220 s, at which point a voltage of about 8 V was applied, a significant drop in anode current occurred, indicating a fuse burn-out event for one of the photodiodes in the array, as shown in the plot of FIG. 9. But even after the fuse burn-out event, the array was successfully biased to an operating voltage of about 68 V. The array was then successfully operated for several hundred seconds with a 4 V overbias with 4 μs gate at 20 kHz. The fuses maintained post-burn-out leakage currents of less than $10^{-7}$ A at 70 V for several minutes of testing with no reconnection of the burned-out fuse. FIG. 10A is a top-down photomicrograph of the fuse array integrated with the photodiode array. FIG. 10B is a magnified photomicrograph view showing one burned-out fuse in the array of fuses. Note that the burned-out fuse site does not overlap with any photodiodes, and that the integrity of the neighboring photodiodes and fuses is maintained even after the electrical shorting event that caused burn-out for one fuse.

These experiments confirmed that aluminum fuses can protect a photodiode array circuit to accommodate a burn-out current of 2 mA-10 mA with fuse structures that are laterally offset from photodiode structures on a photodiode array substrate, and can operate as-specified to protect a Geiger-mode APD array circuitry from short circuit events across the photodiode array. The fuse material thickness, length, and width can be controlled to set a prespecified electrical short circuit current for which protection is needed.

The fuse-enabled APD described herein is particularly well-suited for linear-mode as well as Geiger-mode APD arrays. But in general, the fuse arrangement provided herein can also be employed with any photodiode arrangement. No particular photodiode array configuration or operational limitations are required, and any suitable microfabrication sequence that accommodates fabrication of fuses on a substrate, laterally separated from photodiodes, can be employed. Other device and substrate structures can be included with the photodiode array, such as cross talk absorption materials, cross talk filter materials, lens arrays, and circuit configurations.

The fuse design and configuration provided herein enables both an increase in microfabrication throughput as well as increased operational reliability in the production and operation of photodiode array devices and systems. Conventional microfabrication sequences rely on photodiode device pre-screening for faulty photodiodes, adding cost and time to production. Even with such pre-screening, no additional protection is provided against photodiode failure during the photodiode array operation. With the integration of a fuse array that is offset from a photodiode array, the failure of a photodiode results in loss of that one photodiode alone, rather than the entire array and/or array circuitry. It is recognized that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

I claim:

1. A photodiode array comprising:
   a semiconducting substrate;
   a plurality of photodiodes disposed at a first surface of the semiconducting substrate, each photodiode comprising a mesa of photodiode material layers, having a mesa top surface for electrical connection to the photodiode, and laterally spaced apart from neighboring photodiode mesas by a lateral semiconducting substrate surface region of the first semiconducting substrate surface;
   an optical interface disposed at a surface of the semiconducting substrate opposite the first surface of the semiconducting substrate for accepting external input radiation;
   a plurality of electrically conducting fuses, each fuse comprising a planar fuse material including a first fuse end that is electrically connected to a photodiode in the plurality of photodiodes at the photodiode mesa top surface, the planar fuse material being disposed on the lateral semiconducting substrate surface region of the first semiconducting substrate surface at a fuse height below mesa top surface height and including a second fuse end disposed at the lateral semiconducting substrate surface region, spaced apart from neighboring photodiodes in the plurality of photodiodes, wherein the planar fuse material of each electrically conducting fuse comprises a top surface, at least a portion of the top surface including no layer there on and being exposed to the plurality of electrically conducting fuses; and
   a microelectronic read out integrated circuit substrate disposed adjacent to the plurality of photodiodes at the first surface of the semiconducting substrate, the microelectronic read out integrated circuit substrate being electrically connected to each electrically conducting fuse at the second fuse end and held spaced apart from the planar fuse material top surface of each electrically conducting fuse by a separation distance.

2. The photodiode array of claim 1, wherein the microelectronic read out circuit integrated circuit substrate is electrically connected to the second fuse end by an electrically conducting bump bonded between the second fuse end and the microelectronic read out integrated circuit substrate.

3. The photodiode array of claim 1, wherein each photodiode in the photodiode array comprises an avalanche photodiode.

4. The photodiode array of claim 1, wherein each photodiode in the photodiode array comprises a mesa of photodiode multiplier and absorber material layers.

5. The photodiode array of claim 1 further comprising, for each photodiode, a metal electrical connection from the photodiode mesa top surface to the first end of an electrically conducting fuse disposed at a site on the semiconducting substrate that is laterally spaced apart from the photodiode mesa layers.

6. The photodiode array of claim 5, wherein the metal electrical connection from the photodiode mesa top surface to an electrically conducting fuse is nonplanar.

7. The photodiode array of claim 1, wherein each electrically conducting fuse includes an adhesion layer underlying fuse material.

8. The photodiode array of claim 1, wherein each electrically conducting fuse includes an oxidation inhibitor layer overlying fuse material.

9. The photodiode array of claim 1, wherein each electrically conducting fuse comprises a fuse material region disposed at a lateral semiconducting substrate surface region on top of a layer of passivation material disposed on the semiconducting substrate surface region.

10. The photodiode array of claim 1, wherein the plurality of photodiodes are arranged as photodiode rows and photodiode columns and wherein the plurality of electrically conducting fuses are arranged as electrically conducting fuse rows and electrically conducting fuse columns that are laterally spaced apart from the photodiode rows and photodiode columns.

11. The photodiode array of claim 1, wherein the semiconducting substrate comprises InP and each photodiode mesa of photodiode material layers comprises an InP layer.

12. The photodiode array of claim 1, wherein at least one electrically conducting fuse comprises a fuse length of fuse material that is discontinuous at a site along the fuse length.

13. A photodiode array comprising:
   a semiconducting substrate;
   a plurality of photodiodes disposed at a first surface of the semiconducting substrate with each photodiode comprising a mesa of photodiode material layers, having a top surface for electrical connection to the photodiode, and laterally spaced apart from neighboring photodiodes by a lateral semiconducting substrate surface region of the first semiconducting substrate surface;
   an optical interface disposed at a surface of the semiconducting substrate opposite the first surface of the semiconducting substrate for accepting external input radiation;
   a plurality of electrically conducting fuses disposed on the semiconducting substrate surface, each electrically conducting fuse electrically connected to a photodiode in the plurality of photodiodes by a fuse connection extending between the top surface of a photodiode mesa and a first end of a fuse, and each fuse comprising a planar fuse material that is disposed on the lateral semiconducting substrate surface region at a fuse height below mesa top surface height, and including a second fuse end disposed the lateral semiconducting substrate surface region, spaced apart from neighboring photodiode mesas in the plurality of photodiodes, wherein the fuse material of each fuse comprises a top surface, at least a portion of the top surface including no layer there on and being exposed to the plurality of electrically conducting fuses; and a microelectronic read out integrated circuit substrate disposed adjacent to the plurality of photodiodes at the first surface of the semiconducting substrate, the microelectronic read out integrated circuit substrate being electrically connected to each electrically conducting fuse at the second fuse end and held spaced apart from the fuse material top surface of each electrically conducting fuse by at least about one micron.

14. The photodiode array of claim 13, wherein the second end of each fuse is electrically connected to the microelectronic read out integrated circuit substrate by an electrically conducting bump.

15. the photodiode array of claim 13, wherein the plurality of photodiodes is arranged as photodiode mesa rows and photodiode mesa columns and wherein the plurality of fuses are arranged as fuse rows and fuse columns that are laterally spaced apart from the photodiode mesa rows and photodiode mesa columns.

\* \* \* \* \*